US012811079B2

(12) United States Patent
Cathelin et al.

(10) Patent No.: US 12,811,079 B2
(45) Date of Patent: Nov. 24, 2026

(54) SWITCH BASED ON PHASE-CHANGE MATERIAL

(71) Applicants: STMicroelectronics France, Montrouge (FR); STMicroelectronics (Crolles 2) SAS, Crolles (FR); STMicroelectronics International N.V., Geneva (CH)

(72) Inventors: Philippe Cathelin, Laval (FR); Frederic Gianesello, acu e+ee (FR); Alain Fleury, Barberaz (FR); Stephane Monfray, Eybens (FR); Bruno Reig, Grenoble (FR); Vincent Puyal, Grenoble (FR)

(73) Assignees: STMICROELECTRONICS France, Montrouge (FR); STMicroelectronics (Crolles 2) SAS, Crolles (FR)

( * ) Notice: Subject to any disclaimer, the term of this patent is extended or adjusted under 35 U.S.C. 154(b) by 274 days.

(21) Appl. No.: 18/193,230

(22) Filed: Mar. 30, 2023

(65) Prior Publication Data

US 2024/0186090 A1 Jun. 6, 2024

(30) Foreign Application Priority Data

Dec. 2, 2022 (FR) ....................................... 2212681

(51) Int. Cl.
*H01H 37/34* (2006.01)
*H10N 70/00* (2023.01)
*H10N 70/20* (2023.01)

(52) U.S. Cl.
CPC .......... *H01H 37/34* (2013.01); *H10N 70/231* (2023.02); *H10N 70/826* (2023.02); *H10N 70/8413* (2023.02); *H10N 70/882* (2023.02)

(58) Field of Classification Search
CPC .... H01H 37/34; H10N 70/826; H10N 70/231; H10N 70/8413; H10N 70/882
USPC ........................................................ 337/298
See application file for complete search history.

(56) References Cited

U.S. PATENT DOCUMENTS

| | | | | |
|---|---|---|---|---|
| 7,545,252 | B1 * | 6/2009 | Lantz | F03G 7/066 337/393 |
| 7,755,899 | B2 * | 7/2010 | Stenmark | H01H 37/46 337/393 |
| 9,368,720 | B1 * | 6/2016 | Moon | H10N 70/8828 |
| 9,934,922 | B2 * | 4/2018 | Reig | H10N 70/8613 |
| 10,461,253 | B1 | 10/2019 | Slovin et al. | |

(Continued)

FOREIGN PATENT DOCUMENTS

EP 3457491 A1 3/2019

OTHER PUBLICATIONS

Crunteanu et al., "Out-of-Plane and Inline RF Switches based on $Ge_2Sb_2Te_5$ Phase-Change Material," IEEE, 2014. (4 pages).

(Continued)

*Primary Examiner* — Anatoly Vortman
(74) *Attorney, Agent, or Firm* — Seed Intellectual Property Law Group LLP

(57) ABSTRACT

The present description concerns a switch based on a phase-change material comprising: first, second, and third electrodes; a first region of said phase-change material coupling the first and second electrodes; and —a second region of said phase-change material coupling the second and third electrodes.

20 Claims, 2 Drawing Sheets

(56) References Cited

U.S. PATENT DOCUMENTS

| | | | | |
|---|---|---|---|---|
| 10,490,374 | B2 * | 11/2019 | Borodulin | H10N 70/253 |
| 10,644,067 | B2 * | 5/2020 | Reig | H10N 70/8413 |
| 2006/0102927 | A1 | 5/2006 | Fujita et al. | |
| 2007/0096248 | A1 * | 5/2007 | Philipp | H10N 70/828 257/536 |
| 2009/0040007 | A1 * | 2/2009 | Stenmark | H01H 37/46 337/324 |
| 2011/0038093 | A1 * | 2/2011 | Furukawa | H01G 5/18 257/3 |
| 2012/0181499 | A1 | 7/2012 | Chuang et al. | |
| 2014/0191181 | A1 * | 7/2014 | Moon | H10N 70/011 257/4 |
| 2015/0041917 | A1 | 2/2015 | Zhu et al. | |
| 2016/0079019 | A1 * | 3/2016 | Borodulin | H10N 70/231 337/396 |
| 2018/0138894 | A1 * | 5/2018 | Belot | H10N 79/00 |
| 2018/0159530 | A1 | 6/2018 | Englekirk | |
| 2019/0088721 | A1 * | 3/2019 | Reig | H01P 1/10 |
| 2021/0320250 | A1 | 10/2021 | Heiss et al. | |
| 2022/0199343 | A1 * | 6/2022 | Taddiken | H03K 17/24 |
| 2022/0285614 | A1 | 9/2022 | Li et al. | |
| 2023/0337554 | A1 * | 10/2023 | Wohlmuth | H10N 70/8613 |
| 2023/0343531 | A1 * | 10/2023 | Solomko | H01H 37/14 |
| 2024/0023465 | A1 | 1/2024 | Reig et al. | |
| 2024/0023467 | A1 | 1/2024 | Monfray et al. | |
| 2024/0023468 | A1 * | 1/2024 | Fleury | H10N 70/011 |
| 2024/0276897 | A1 * | 8/2024 | Chen | H10N 70/8613 |

OTHER PUBLICATIONS

El-Hinnawy et al., "A 25 THz $F_{CO}$ (6.3 fs $R_{ON}$* $C_{OFF}$) Phase-Change Material RF Switch Fabricated in a High Volume Manufacturing Environment with Demonstrated Cycling > 1 Billion Times," IEEE/MTT-S International Microwave Symposium, p. 45-48, 2020.

El-Hinnawy et al., "A Four-Terminal, Inline, Chalcogenide Phase-Change RF Switch Using an Independent Resistive Heater for Thermal Actuation," *IEEE Electron Device Letters* 34(10):1313-1315, Oct. 2013.

El-Hinnawy et al., "Experimental Demonstration of AlN Heat Spreaders for the Monolithic Integration of Inline Phase-Change Switches," *IEEE Electron Device Letters* 39(4):610-613, Apr. 2018.

El-Hinnawy et al., "Switch Stacking for OFF-State Power Handling Improvements in PCM RF Switches," 2021 IEEE/MTT-S International Microwave Symposium, p. 424-427.

Joseph et al., "Power Handling Capability of an SOI RF Switch," 2013 IEEE Radio Frequency Integrated Circuits Symposium, p. 385-388.

Léon et al., "High Performance and Low Energy Consumption in Phase Change Material RF Switches," Proceedings of the 48th European Microwave Conference, p. 401-404, 2018.

Léon et al., "RF Power-Handling Performance for Direct Actuation of Germanium Telluride Switches," *IEEE Transactions on Microwave Theory and Techniques* 68(1):60-73, Jan. 2020.

Mennai et al., "Bistable RF Switches Using $Ge_2Sb_2Te_5$ Phase Change Material," Proceedings of the 45th European Microwave Conference, p. 45-47, 2015.

Moon et al., "5 THz Figure-of-Merit Reliable Phase-change RF Switches for Millimeter-wave Applications," 2018 IEEE/MTT-S International Microwave Symposium, p. 836-838, 2018.

Slovin et al., "Phase-Change Material RF Switches and Monolithic Integration in 180 nm RF-SOI CMOS Processes," 2021 IEEE International Electron Devices Meeting (IEDM), 2021. (4 pages).

Wainstein et al., "Compact Modeling and Electrothermal Measurements of Indirectly Heated Phase-Change RF Switches," *IEEE Transactions on Electron Devices* 67(11):5182-5187, Nov. 2020.

Wainstein et al., "Indirectly Heated Switch as a Platform for Nanosecond Probing of Phase Transition Properties in Chalcogenides," *IEEE Transactions on Electron Devices* 68(3):1298-1303, Mar. 2021.

Young et al., "Improvements in GeTe-based Phase Change RF Switches," 2018 IEEE/MTT-S International Microwave Symposium, p. 832-835, 2018.

U.S. Appl. No. 18/186,109, filed Mar. 17, 2023.

U.S. Appl. No. 18/186,103, filed Mar. 17, 2023.

U.S. Appl. No. 18/190,901, filed Mar. 27, 2023.

* cited by examiner

SWITCH BASED ON PHASE-CHANGE MATERIAL

CROSS-REFERENCE TO RELATED APPLICATION(S)

This application claims the priority benefit of French patent application number 2212681, filed on Dec. 2, 2022, entitled “Commutateur à base de matériau à changement de phase,” which is hereby incorporated by reference to the maximum extent allowable by law.

BACKGROUND

Technical Field

The present disclosure generally concerns electronic devices. The present disclosure more particularly concerns switches based on a phase-change material capable of alternating between a crystal phase, electrically conductive, and an amorphous phase, electrically insulating.

Description of the Related Art

Various applications take advantage of switches, or circuit breakers, based on a phase-change material to allow or prevent the flowing of an electric current in a circuit. Such switches may particularly be implemented in radio frequency communication applications, for example, to switch an antenna between transmit and receive modes, to activate a filter corresponding to a frequency band, etc.

BRIEF SUMMARY

There is a need to improve existing switches based on a phase-change material.

An embodiment overcomes all or part of the disadvantages of known switches based on a phase-change material.

An aspect of an embodiment more particularly aims at a switch having an increased switching speed.

Another aspect of an embodiment more particularly aims at a switch having an improved voltage, or power, behavior.

For this purpose, an embodiment provides a switch based on a phase-change material comprising:

- first, second, and third electrodes;
- a first region made of said phase-change material coupling the first and second electrodes; and
- a second region made of said phase-change material coupling the second and third electrodes.

According to an embodiment, the first and second regions made of said phase-change material have, in top view, different areas.

According to an embodiment, the first and second regions made of said phase-change material have, along the conduction direction of the switch, a same lateral dimension.

According to an embodiment, the first and second regions of said phase-change material have, along a direction orthogonal to the conduction direction of the switch, different lateral dimensions.

According to an embodiment, each of the first and second regions of said phase-change material comprises one or a plurality of pillars, each extending in said region, the pillar(s) being made of a material having a thermal conductivity greater than that of said phase-change material.

According to an embodiment, the material of the pillar(s) is electrically insulating.

According to an embodiment, the material of the pillar(s) is selected from among aluminum nitride or silicon nitride.

According to an embodiment, each pillar has a maximum lateral dimension equal to approximately 300 nm.

According to an embodiment, each pillar is separated from the neighboring pillars by a distance in the order of 300 nm.

According to an embodiment, said phase-change material is a chalcogenide material.

According to an embodiment, the switch further comprises first and second heating elements respectively located in front of the first and second regions of said phase-change material, each heating element being electrically insulated from said region located in front thereof.

According to an embodiment, the first and third electrodes are conduction electrodes of the switch.

BRIEF DESCRIPTION OF THE SEVERAL VIEWS OF THE DRAWINGS

The foregoing and other features and advantages of the present disclosure will be discussed in detail in the following non-limiting description of specific embodiments in connection with the accompanying drawing, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the circuits for controlling switches based on a phase-change material and the applications where such switches may be provided have not been detailed, the described embodiments and variants being compatible with usual circuits for controlling switches based on a phase-change material and with usual applications implementing switches based on a phase-change material.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms “front,” “back,” “top,” “bottom,” “left,” “right,” etc., or relative positions, such as terms “above,” “under,” “upper,” “lower,” etc., or to terms qualifying directions, such as terms “horizontal,” “vertical,” etc., it is referred, unless specified otherwise, to the orientation of the drawings.

Unless specified otherwise, the expressions "about," "approximately," "substantially," and "in the order of" signify plus or minus 10%, preferably of plus or minus 5%.

Figure 1A:
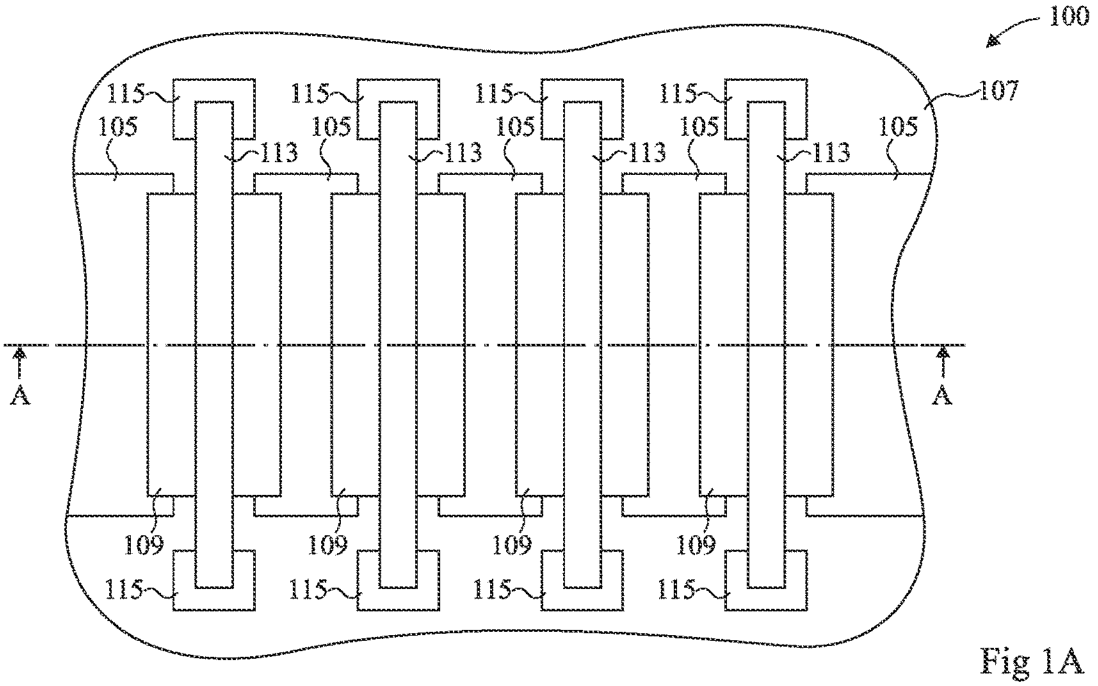
FIG. 1A and FIG. 1B are simplified and partial views, respectively a top view and a cross-section view along plane AA of FIG. 1A, of an example of a switch based on a phase-change material according to an embodiment.
Figure 1B:
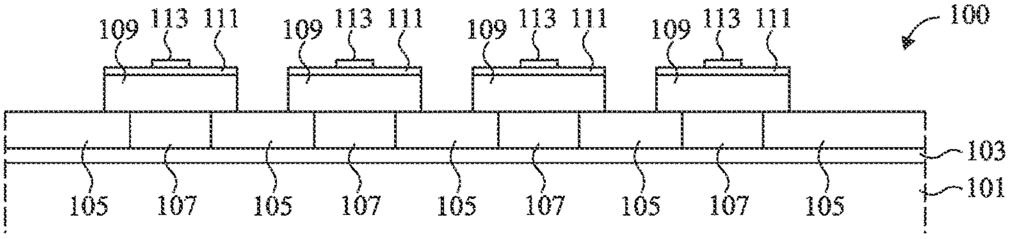

FIG. 1A and FIG. 1B are simplified and partial views, respectively a top view and a cross-section view along plane AA of FIG. 1A, of an example of a switch 100 based on a phase-change material according to an embodiment.

In the shown example, switch 100 is formed inside and on top of a substrate 101, for example, a wafer or a piece of wafer made of a semiconductor material, for example, silicon.

Optionally, substrate 101 is coated, on one of its surfaces (its upper surface in the orientation of FIG. 1B), with an electrically-insulating layer 103. As an example, insulating layer 103 is made of silicon dioxide and has a thickness in the order of 500 nm.

In the shown example, switch 100 comprises five coplanar electrodes 105 located on top of and in contact with the surface of insulating layer 103 opposite to substrate 101. The two electrodes 105 most distant from each other (called radio frequency electrodes), respectively located at the left-hand and right-hand ends of switch 100, in the orientation of FIGS. 1A and 1B, are for example conduction electrodes intended to be connected to a radio frequency communication circuit (not detailed). In this example, the three other electrodes 105, laterally interposed between the two conduction electrodes 105, are for example intermediate electrodes intended to be coupled or connected to no other conductive element and are for example each at a floating potential.

Electrodes 105 are for example made of a conductive material, for example, a metal, for example, copper or aluminum, or of a metal alloy. Each electrode 105 may have a monolayer structure and a multilayer structure for example comprising, from the upper surface of insulating layer 103, a titanium layer having a thickness in the order of 10 nm, a layer made of an alloy of copper and aluminum having a thickness in the order of 440 nm, another titanium layer having a thickness in the order of 10 nm, and a titanium nitride layer having a thickness in the order of 100 nm. As an example, each electrode 105 has, in top view, a substantially rectangular shape.

In the example illustrated in FIGS. 1A and 1B, another electrically-insulating layer 107 coats portions of the upper surface of insulating layer 103 which are not coated with electrodes 105. The material of insulating layer 107 coats the lateral surfaces of electrodes 105 and fills the free spaces laterally extending between electrodes 105. Layer 107 electrically insulates electrodes 105 from one another. In the shown example, insulating layer 107 is flush with the upper surface of electrodes 105. As an example, insulating layer 107 is made of the same material as insulating layer 103, for example, of silicon dioxide.

In the shown example, switch 100 further comprises four regions 109 made of a phase-change material. In the illustrated example, the regions 109 of said phase-change material are separate and each couple two adjacent electrodes 105 of switch 100. More precisely, in the shown example, a first region 109 couples a first electrode 105 (for example, the left-hand conduction electrode 105, in the orientation of FIGS. 1A and 1B) to a second electrode 105 adjacent to first electrode 105 (the intermediate electrode 105 closest to first electrode 105, in this example), and a second region 109, different from first region 109, couples second electrode 105 to a third electrode 105 adjacent to second electrode 105 (the intermediate electrode 105 closest to second electrode 105, in this example). Further, in this example, a third region 109, different from the first and second regions 109, couples the third electrode 105 to a fourth electrode 105 adjacent to the third electrode 105 (the intermediate electrode 105 closest to the third electrode 105, in this example) and a further region 109, different from the first, second, and third regions 109, couples the fourth electrode 105 to a fifth electrode 105 adjacent to the fourth electrode 105 (the right-hand conduction electrode 105, in this example). Each region 109 of phase-change material coats the upper surface of a portion of layer 107 laterally extending between the two adjacent electrodes 105 that it couples, and further extends on top of and in contact with a portion of the upper surface of each of said electrodes 105. Each region 109 of phase-change material has for example, in top view, a substantially rectangular shape.

In the illustrated example, the regions 109 of phase-change material of switch 100 have, in top view, substantially identical areas, to within manufacturing dispersions. As an example, each region 109 of phase-change material has a length in the order of one or a plurality of micrometers, for example, equal to approximately 1 μm, the length of each region 109 corresponding to a lateral dimension of said region 109 measured along the conduction direction of switch 100. In the shown example, regions 109 of phase-change material further have a same width, for example, in the order of several micrometers or of several tens of micrometers, the width of each region 109 corresponding to a lateral dimension of said region 109 measured along a direction orthogonal to the conduction direction of switch 100 (along a direction orthogonal to the cross-section plane of FIG. 1B). Each region 109 of phase-change material has for example a thickness in the range from 100 to 300 nm.

As an example, each region 109 of switch 100 is made of a material called "chalcogenide," that is, a material or an alloy comprising at least one chalcogen element, for example, a material from the family of germanium telluride, antimony telluride, or germanium antimony telluride, more commonly designated with acronym "GST." As a variant, each region 109 is made of vanadium dioxide.

Generally, phase-change materials are materials capable of alternating, under the effect of a temperature variation, between a crystal phase and an amorphous phase, the amorphous phase having an electric resistance greater than that of the crystal phase. In the case of switch 100, advantage is taken of this phenomenon to obtain a non-conductive state, preventing the flowing of a current between electrodes 105, when a portion at least of the material of regions 109 is in the amorphous phase, and a conductive state, allowing the flowing of the current between electrodes 105, when the material of regions 109 is in the crystal phase.

In the shown example, the surface of each region 109 opposite to substrate 101 (the upper surface of each region 109, in the orientation of FIG. 1B) is coated with an electrically-insulating layer 111. As an example, insulating layers 111 are made of a dielectric and thermally-conductive material, for example silicon nitride or aluminum nitride. Insulating layers 111 have not been shown in FIG. 1A to avoid overloading the drawing.

In the illustrated example, switch 100 further comprises four heating elements 113 respectively located on top of and in contact with the upper surfaces of layers 111, vertically in line with the four regions 109 of phase-change material. Each heating element 113 is electrically insulated from the underlying region 109 by the corresponding layer 111. In the shown example, each heating element 113 has the shape of a rectangular strip extending along a direction substantially orthogonal to the conduction direction of switch 100. In the illustrated example, the two ends of each heating element 113 are respectively connected to two control electrodes 115. The control electrodes 115 of each heating element 113 are for example electrically insulated from the control electrodes 115 of the other heating elements 113. As an example, each heating element 113 of switch 100 is coupled or connected, by its electrodes 115, to a control circuit distinct from control circuits of the other heating elements 113. To avoid overloading the drawing, the control circuits of heating elements 113 have not been shown in FIGS. 1A and 1B.

Each heating element 113 for example has a thickness in the order of 100 nm and a width in the range from a few hundreds of nanometers to a few micrometers, for example in the range from 500 nm to 3.5 μm, the width of each heating element 113 corresponding to the lateral dimension of said heating element 113 measured along the conduction direction of switch 100. As an example, each heating element 113 is made of a metal, for example, tungsten, or of a metal alloy, for example, titanium nitride.

Although this has not been illustrated in the drawings, the structure of switch 100 may be coated, on the upper surface side of substrate 101, with a thermally-insulating layer intended to confine the heat generated by heating elements 113.

During the switching of switch 100 between the on and off states, the control electrodes 115 of the heating elements 113 of switch 100 are for example simultaneously submitted to a control voltage causing a current flow through heating elements 113. This current causes, by Joule effect and then by radiation and/or conduction inside of the structure of switch 100, particularly through layers 111, a temperature rise of the underlying regions 109 from their upper surfaces, located in front of the respective heating elements 113.

More precisely, to have switch 100 switch from the off state to the on state, the regions 109 of phase-change material are heated, by means of heating elements 113, for example at a temperature T1, and for a duration d1. Temperature T1 and duration d1 are selected to cause a phase change of the material of regions 109 from the amorphous phase to the crystal phase. Temperature T1 is for example higher than a crystallization temperature and lower than a melting temperature of the material of regions 109. As an example, temperature T1 is in the range from 150 to 350° C. and duration d1 is shorter than 1 μs. In the case where regions 109 are made of germanium telluride, temperature T1 is for example equal to approximately 300° C. and duration d1 is for example in the range from 100 ns to 1 μs.

Conversely, to have switch 100 switch from the on state to the off state, the regions 109 of phase-change material are heated, by means of heating elements 113, for example at a temperature T2 higher than temperature T1, and for a duration d2 shorter than duration d1. Temperature T2 and duration d2 are selected to cause a phase change of the material of regions 109 from the crystal phase to the amorphous phase. Temperature T2 is for example higher than the melting temperature of the phase-change material. As an example, temperature T2 is in the range from 600 to 1,000° C. and duration d2 is shorter than 500 ns. In the case where regions 109 are made of germanium telluride, temperature T2 is for example equal to approximately 700° C. and duration d2 is for example equal to approximately 100 ns.

Switch 100 is said to be "indirectly heated," the temperature rise of the phase-change material being obtained by the flowing of a current through an electrically-heating element insulated from the phase-change material, as opposed to switches of "direct heating" type, which comprise no heating element and where the temperature rise results from a current flow directly through the phase-change material. In the case of a directly heated switch, the control electrodes are for example connected to two opposite sides of the region of phase-change material, for example, along a direction orthogonal to the conduction path of the switch. A disadvantage of directly heated switches lies in the fact that, when the switch is on, an electric conduction path is created through the phase-change material between the control electrodes and the conduction electrodes of the switch. This causes leakage currents, which disturb the signal transmitted between the conduction electrodes.

The fact of providing a plurality of regions 109 of phase-change material advantageously enables to decrease the quantity of electrical energy and the duration necessary for each switching while enabling, in the off state, to reach a high breakdown voltage, for example, greater than or equal to 4 V, between the conduction electrodes 105 of switch 100. Switch 100 thus has, as compared with an analog switch comprising a single region of phase-change material having a volume substantially identical to the sum of the volumes of the regions 109 of phase-change material of switch 100, a higher switching speed, a lower energy consumption, and a higher reliability.

Figure 2:
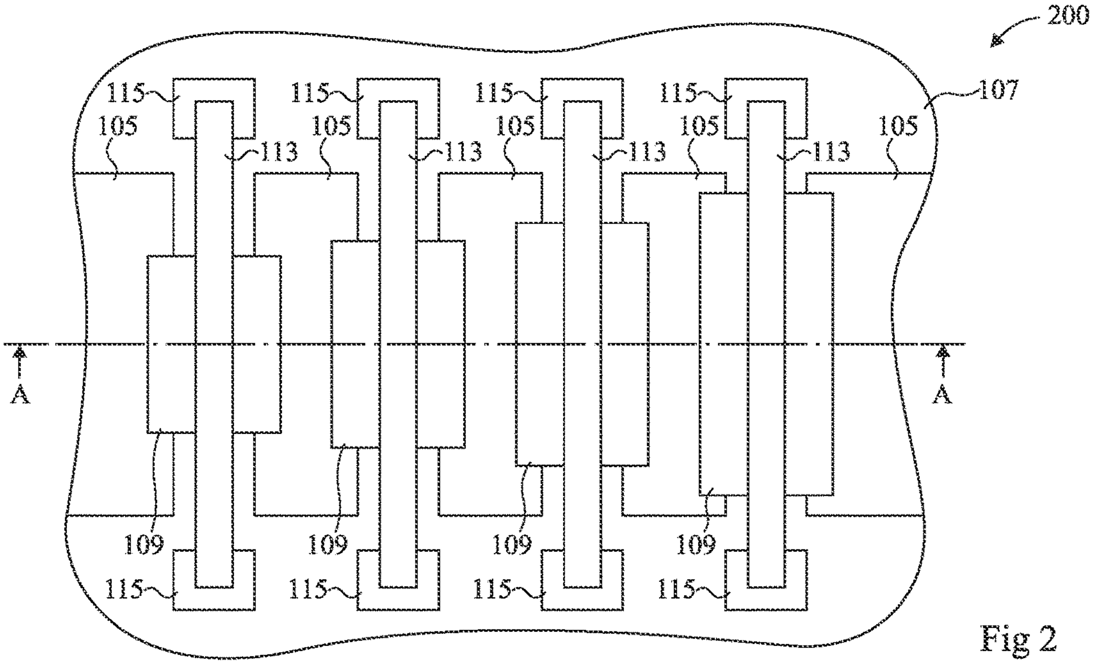
FIG. 2 is a simplified and partial top view of an example of a switch based on a phase-change material according to an embodiment.

FIG. 2 is a simplified and partial top view of an example of a switch 200 based on a phase-change material according to an embodiment. Switch 200 for example has, in cross-section view along plane AA of FIG. 2, a structure identical or similar to that used in FIG. 1B. Insulating layers 111 have not been shown in FIG. 2 to avoid overloading the drawing.

The switch 200 of FIG. 2 comprises elements common with the switch 100 of FIG. 1. These common elements will not be detailed again hereafter.

The switch 200 of FIG. 2 differs from the switch 100 of FIG. 1 in that the regions 109 of phase-change material of switch 200 have, in top view, different areas. In the illustrated example, the regions 109 of phase-change material have, along the conduction direction of switch 200, from one of the conduction electrodes 105 to the other conduction electrode 105 (from the left-hand end electrode 105 to the right-hand end electrode 105, in the orientation of FIG. 2), increasing areas. In the shown example, the regions 109 of phase-change material have the same length to within manufacturing dispersions, and different widths, for example increasing between the two conduction electrodes 105 of switch 200. As an example, the conduction electrode 105 in contact with the region 109 having the largest area is adapted to being taken to a high potential, for example, greater than or equal to 4 V, the other conduction electrode 105, in contact with the region 109 having the smallest area, in this example, being intended to be taken to a reference potential, for example, the radio frequency ground. Further, the difference in areas, or widths, between two successive regions 109 of phase-change material is all the greater as the regions 109 are close to the conduction electrode 105 in contact with the region 109 having the largest area (close to the right-hand end electrode 105, in the orientation of FIG. 2).

The width, or the area, of each region 109 is for example determined so that, when switch 200 is in the off state and a voltage, resulting from the application of the radio frequency signal, is applied between its conduction electrodes 105, the resulting voltages individually applied to each region 109, that is, for each region 109, the voltage applied between the two electrodes 105 that it couples, are substantially identical, or balanced. This advantageously enables to improve the breakdown voltage of switch 200.

Figure 3A:
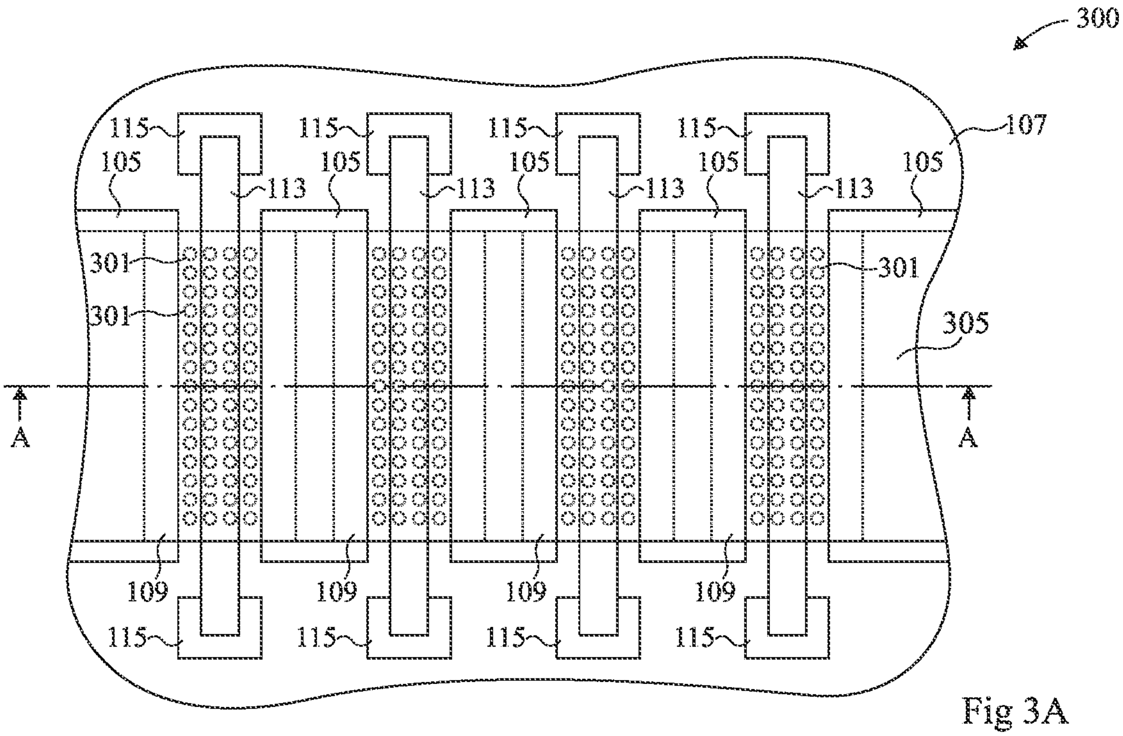
FIG. 3A and FIG. 3B are simplified and partial views, respectively a top view and a cross-section view along plane AA of FIG. 3A, of an example of a switch based on a phase-change material according to an embodiment.
Figure 3B:
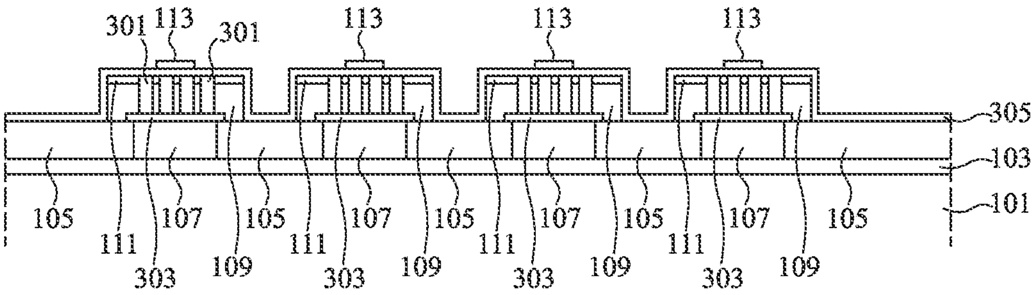

FIG. 3A and FIG. 3B are simplified and partial views, respectively a top view and a cross-section view along plane AA of FIG. 3A, of an example of a switch 300 based on a phase-change material according to an embodiment.

In the shown example, switch 300 comprises pillars 301 extending in each region 109 of phase-change material. More precisely, in the illustrated example, pillars 301 extend vertically across the entire thickness of regions 109.

Pillars 301 are for example made of a material having a thermal conductivity greater than that of the phase-change material of regions 109. As an example, pillars 301 are made of an electrically-insulating and thermally conductive material, for example, silicon nitride, aluminum nitride, etc. As a variant, pillars 301 may be made of an electrically and thermally conductive material, for example, a metal. However, for an implementation of switch 300 in radio frequency communication applications, the use of pillars 301 made of an electrically-insulating material is preferred so as to limit or, to avoid, the occurrence of parasitic capacitive phenomena.

In the shown example, pillars 301 each have, in top view, a substantially circular cross-section. This example is however not limiting, and pillars 301 may have any shape, for example, a cross-section of rectangular or square shape. As an example, each pillar 301 has a maximum lateral dimension (for example, a diameter, in the shown example where the pillars have a substantially circular cross-section) equal to approximately 300 nm. Further, each pillar 301 is for example separated from the neighboring pillars 301 by a distance in the order of 300 nm. Pillars 301 are for example distributed, inside of each region 109 of phase-change material, according to a periodic pattern. Although an example where each region 109 of switch 300 comprises a few tens of pillars 301 has been illustrated, each region 109 of switch 300 may comprise any number, greater than or equal to one, of pillars 301.

The presence of pillars 301 provides the advantage that the heat generated by each heating element 113 is more efficiently propagated in the underlying region 109 of phase-change material. In particular, as compared with switches 100 and 200 having their regions 109 heated mainly from their respective upper surfaces, the heat originating from the heating elements 113 of switch 300 further diffuses to the heart of the phase-change material of the underlying regions 109. Switch 300 thus has a thermal efficiency greater than that of switches 100 and 200.

In the case of switch 300, for a same control voltage applied between the control electrodes 115 of heating elements 113, the latter undergo, with respect to the heating elements 113 of switch 100, a lower temperature rise. Further, for the same control voltage, the regions 109 of switch 300 undergo, as compared with the regions 109 of switch 100, a higher temperature rise. The difference between the temperatures respectively reached by heating element 113 and by region 109 during the switching steps is lower in the case of switch 300 than in the case of switch 100.

For comparable thicknesses of regions 109, switch 300 enables to access switching durations shorter, or switching speeds greater, than those of switch 100. It is advantageously possible to take advantage of the increased thermal efficiency of switch 300 to increase the thickness of region 109 with respect to switch 100, to decrease the figure of merit of switch 300, without degrading the switching durations with respect to switch 100. Heating elements 113 may further advantageously be drawn away from the underlying regions 109. This then causes an off-state capacitance decrease, and thus an improvement of the figure of merit, of switch 300 with respect to switch 100.

In the shown example, pillars 301 cross layers 111 across their entire thickness. More precisely, in this example, each pillar 301 extends vertically from the upper surface of one of insulating layers 111 to the lower surface of the underlying region 109.

In the illustrated example, switch 300 further comprises, optionally, separate electrically-insulating regions 303, each coating a portion of the electrically-insulating layer 107 extending between two adjacent electrodes 105, region 303 further extending on top of and in contact with a portion of the upper surface of each of said electrodes 105. Each region 303 for example has a thickness in the order of 20 nm. As an example, electrically-insulating regions 303 are made of a dielectric material, for example, silicon nitride.

In the shown example, switch 300 further comprises an electrically-insulating layer 305 interposed between layers 111 and the overlying heating elements 113. In the illustrated example, layer 305 coats the upper surface of pillars 301, the upper surface and the sides of layers 111, the sides of regions 109, and the exposed portions of the upper surfaces of electrodes 105. As an example, layer 305 is made of an electrically-insulating and thermally-conductive material, for example, the same material as that of pillars 301, for example, silicon nitride or aluminum nitride.

Switch 300 has a structure where heating elements 113 are more distant from substrate 101 than the layers 109 of phase-change material. This causes the presence of a low thermal capacity, since heating elements 113 may be located close to ambient air. This advantageously results in rapid thermal exchanges, and thus in decreased switching times.

Various embodiments and variants have been described. Those skilled in the art will understand that certain features of these various embodiments and variants may be combined, and other variants will occur to those skilled in the art. In particular, those skilled in the art are capable, based on the indications of the present disclosure, of combining the embodiment of switch 300 with those of switches 100 and 200, by in particular providing pillars similar or identical to the pillars 301 of switch 300 in each region 109 of phase-change material of switches 100 and 200.

Further, although examples of switches 100, 200, and 300 each comprising five electrodes 105 and four regions 109 of phase-change material have been shown and described, those skilled in the art are capable of adapting the embodiments of the present disclosure to switches based on phase-change material comprising an integer number N greater than or equal to three electrodes 105 and a number N−1 of regions 109 of phase-change material, the region 109 of rank k ($1 \le k \le N-1$) coupling the electrode 105 of rank k to the electrode 105 of rank k+1.

Further, although examples of switches 100, 200, and 300 having coplanar electrodes 105 have been shown and described, these examples are not limiting and those skilled in the art are capable of adapting the described embodiments to a case where the electrodes 105 of the switch are not coplanar.

Finally, the practical implementation of the described embodiments and variants is within the abilities of those skilled in the art based on the functional indications given hereabove. In particular, the described embodiments are not limited to the specific examples of materials and of dimensions mentioned in the present disclosure.

Switch (100; 200; 300) based on a phase-change material may be summarized as including first, second, and third electrodes (105); a first region (109) of said phase-change material coupling the first and second electrodes; and a second region (109) of said phase-change material coupling the second and third electrodes.

The first and second regions (109) of said phase-change material may have, in top view, different areas.

The first and second regions (109) of said phase-change material may have, along the conduction direction of the switch (100; 200; 300), a same lateral dimension.

The first and second regions (109) of phase-change material may have, along a direction orthogonal to the conduction direction of the switch (100; 200; 300), different lateral dimensions.

Each of the first and second regions (109) of said phase-change material may include one or a plurality of pillars (301) each extending in said region, the pillar(s) being made of a material having a thermal conductivity greater than that of said phase-change material.

The material of the pillar(s) (301) may be electrically insulating.

The material of the pillar(s) (301) may be selected from among aluminum nitride and silicon nitride.

Each pillar (301) may have a maximum lateral dimension equal to approximately 300 nm.

Each pillar (301) may be separated from the neighboring pillars by a distance in the order of 300 nm.

Said phase-change material may be a chalcogenide material.

Switch may further include first and second heating elements (113) respectively located in front of the first and second regions (109) made of said phase-change material, each heating elements being electrically insulated from said region located in front thereof.

The first and third electrodes (105) may be conduction electrodes of the switch (100; 200; 300).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A phase-change material switch, comprising:

first, second, and third electrodes aligned along a first direction;

a first region of a phase-change material coupling the first and second electrodes;

a second region of the phase-change material coupling the second and third electrodes;

a plurality of pillars extending through the first region of the phase-change material along a second direction transverse to the first direction, each pillar of the plurality of pillars being separated from adjacent pillars of the plurality of pillars by the phase-change material;

an electrically-insulating region in the first region of the phase-change material and extending between the first and second electrodes along the first direction, the plurality of pillars being on the electrically-insulating region; and an electrically-insulating layer directly on the first, second, and third electrodes and directly on the plurality of pillars and the first region of the phase-change material, the electrically-insulating layer on the first, second, and third electrodes being aligned with the electrically-insulating region along the first direction.

2. The switch according to claim 1, wherein the first and second regions of the phase-change material have, along a conduction direction of the switch, a same lateral dimension.

3. The switch according to claim 1, wherein the plurality of pillars include a material having a first thermal conductivity greater than a second thermal conductivity of the phase-change material.

4. The switch according to claim 3, wherein the material of the plurality of pillars is electrically insulating.

5. The switch according to claim 3, wherein the material of the plurality of pillars is selected from among aluminum nitride and silicon nitride.

6. The switch according to claim 3, wherein each pillar has a maximum lateral dimension equal to approximately 300 nm.

7. The switch according to claim 3, wherein each pillar is separated from neighboring pillars of the plurality of pillars by a distance in the order of 300 nm.

8. The switch according to claim 1, wherein the phase-change material is a chalcogenide material.

9. The switch according to claim 1, further comprising first and second heating elements respectively located on the first and second regions of the phase-change material, each heating element being electrically insulated from the respective region of the phase-change material located thereon.

10. The switch according to claim 1, wherein the first and third electrodes are conduction electrodes of the switch.

11. A device, comprising:

a substrate;

a first electrode on the substrate;

a second electrode on the substrate;

a third electrode on the substrate, the second electrode being between the first and third electrode along a first direction;

a first phase change material on the first electrode and the second electrode;

a second phase change material on the second electrode and the third electrode;

a first electrically-insulating layer between the first electrode and the second electrode on the substrate;

a plurality of pillars extending through the first phase change material along a second direction transverse to the first direction, each pillar of the plurality of pillars being separated from adjacent pillars of the plurality of pillars by the first phase-change material;

a first electrically-insulating region in the first phase change material and on the first electrode and the second electrode, the first electrically-insulating region being between the plurality of pillars and the first electrically-insulating layer along the second direction; and a second electrically-insulating layer directly on the first, second, and third electrodes, on the first and second phase change materials, and on the plurality of pillars, the second electrically-insulating layer being aligned with first electrically-insulating region along the first direction.

12. The device of claim 11, comprising a second electrically-insulating region extending between the second and third electrodes.

13. The device of claim 12, wherein the first phase change material is on the first electrically-insulating region and the second phase change material is on the second electrically-insulating region.

14. The device of claim 13, comprising a first heating element on the first phase change material and a second heating element on the second phase change material.

15. A device, comprising:

a substrate;

a first electrode on the substrate;

a second electrode on the substrate;

a first electrically insulating layer between the first and second electrodes;

a first phase change material region on the first electrically insulating layer and on portions of the first and the second electrodes, the first phase change material region including a first plurality of pillars, each pillar of the first plurality of pillars being separated from adjacent pillars of the first plurality of pillars by the phase-change material region;

a first electrically insulating region on the first electrode, the second electrode, and the first electrically insulating layer, the first electrically insulating region separating the first plurality of pillars from the first electrically insulating layer; and a second electrically insulating layer directly on the first and second electrodes and directly on the plurality of pillars and the first phase change material region, the second electrically-insulating layer on the first and second electrodes being aligned with the first electrically insulating region.

16. The device of claim 15, comprising a third electrode on the substrate and a second electrically insulating layer between the second and third electrodes.

17. The device of claim 16, comprising a second phase change material region on portions of the second and the third electrodes, the second phase change material region including a second plurality of pillars.

18. The device of claim 17, comprising a first heating element on the first phase change material region and a second heating element on the second phase change material region.

19. The device of claim 18, comprising a third electrically insulating layer between the first phase change material region and the first heating element and a fourth electrically insulating layer between the second phase change material region and the second heating element.

20. The device of claim 19, wherein the second electrically insulating layer is directly on a plurality of sidewalls of each first and second phase change material region.

* * * * *